United States Patent
Davidovici

(10) Patent No.: US 7,782,369 B2
(45) Date of Patent: Aug. 24, 2010

(54) SYSTEM AND METHOD FOR A HIGH DYNAMIC RANGE SENSITIVE SENSOR ELEMENT OR ARRAY WITH GAIN CONTROL

(75) Inventor: Sorin Davidovici, Oceanport, NJ (US)

(73) Assignee: RJS Technology, Inc., Hollis, NH (US)

( * ) Notice: Subject to any disclaimer, the term of this patent is extended or adjusted under 35 U.S.C. 154(b) by 796 days.

(21) Appl. No.: 11/533,870

(22) Filed: Sep. 21, 2006

(65) Prior Publication Data

US 2007/0064128 A1 Mar. 22, 2007

Related U.S. Application Data

(60) Provisional application No. 60/719,306, filed on Sep. 21, 2005, provisional application No. 60/719,304, filed on Sep. 21, 2005, provisional application No. 60/719,305, filed on Sep. 21, 2005, provisional application No. 60/727,897, filed on Oct. 18, 2005.

(51) Int. Cl.
*H04N 5/235* (2006.01)
*H04N 5/20* (2006.01)

(52) U.S. Cl. ............ 348/229.1; 348/255; 348/297

(58) Field of Classification Search ......... 348/255, 348/678, 229.1
See application file for complete search history.

(56) References Cited

U.S. PATENT DOCUMENTS

| | | | |
|---|---|---|---|
| 4,352,210 A | 9/1982 | Puckette | |
| 4,419,692 A | 12/1983 | Modisette | |
| 4,629,879 A | 12/1986 | Baldwin | |
| 4,825,144 A | 4/1989 | Alberkrack | |
| 5,416,616 A | 5/1995 | Jenkins et al. | |
| 5,461,426 A | 10/1995 | Limberg | |
| 5,703,641 A | 12/1997 | Watanabe | |
| 5,737,018 A * | 4/1998 | Shimizu et al. | 348/363 |
| 6,188,056 B1 | 2/2001 | Kalnitsky | |
| 6,437,850 B2 | 8/2002 | Vernackt | |
| 6,794,922 B2 | 9/2004 | Mashimo | |
| 6,809,358 B2 | 10/2004 | Hsich et al. | |
| 6,821,245 B2 | 11/2004 | Cline | |
| 6,849,841 B2 | 2/2005 | Byren | |
| 6,867,693 B1 | 3/2005 | Radin | |
| 7,123,301 B1 * | 10/2006 | Nakamura et al. | 348/301 |

(Continued)

FOREIGN PATENT DOCUMENTS

EP 0365294 A2 4/1990

(Continued)

OTHER PUBLICATIONS

International Search Report PCT/US06/36793, Apr. 2, 2007, Davidovici.

(Continued)

*Primary Examiner*—Ngoc-Yen T Vu
(74) *Attorney, Agent, or Firm*—Lindsay G. McGuinness

(57) ABSTRACT

A high dynamic range sensitive sensor element or array is provided which uses phase domain integration techniques to accurately capture high and low intensity images. The sensor element of the present invention is not limited by dynamic range characteristics exhibited by prior art solid-state pixel structures and is thus capable of capturing a full range of electromagnetic radiation to provide a high quality output image.

16 Claims, 19 Drawing Sheets

U.S. PATENT DOCUMENTS

| | | | |
|---|---|---|---|
| 7,133,074 B1 * | 11/2006 | Brehmer et al. | 348/308 |
| 7,277,129 B1 * | 10/2007 | Lee | 348/308 |
| 2002/0033714 A1 | 3/2002 | Perrott | |
| 2002/0176009 A1 | 11/2002 | Johnson | |
| 2002/0176067 A1 | 11/2002 | Charbon | |
| 2003/0076484 A1 * | 4/2003 | Bamji et al. | 356/5.1 |
| 2003/0150977 A1 | 8/2003 | Yamazaki | |
| 2003/0184673 A1 | 10/2003 | Skow | |
| 2005/0046719 A1 | 3/2005 | Inui | |
| 2005/0185064 A1 | 8/2005 | Ogawa | |

FOREIGN PATENT DOCUMENTS

| | | |
|---|---|---|
| EP | 1484740 A2 | 12/2004 |
| WO | WO0038409 A1 | 6/2000 |

OTHER PUBLICATIONS

International Search Report PCT/US06/36785, May 11, 2007, Davidovici.
International Search Report PCT/US06/36794, May 22, 2007, Davidovici.
International Search Report PCT/US06/40340, Aug. 28, 2007, Davidovici.
Vu, T T et al. "A GAAS Phase Digitizing and summing system for microwave signal storage" IEEE Journal of Solid-State Circuits, IEEE Service Center, Piscataway NJ US vol. 24, No. 1, Feb. 1, 1989 pp. 104-117.
EP06815089 Supplementary Search Report Aug. 27, 2009.
EP06815090.3 Supplemental Search Report Aug. 28, 2009.
EP06836131 Supplemental Search Report Aug. 27, 2009.
EP06815082 Supplemental Search Report Sep. 8, 2009.

* cited by examiner

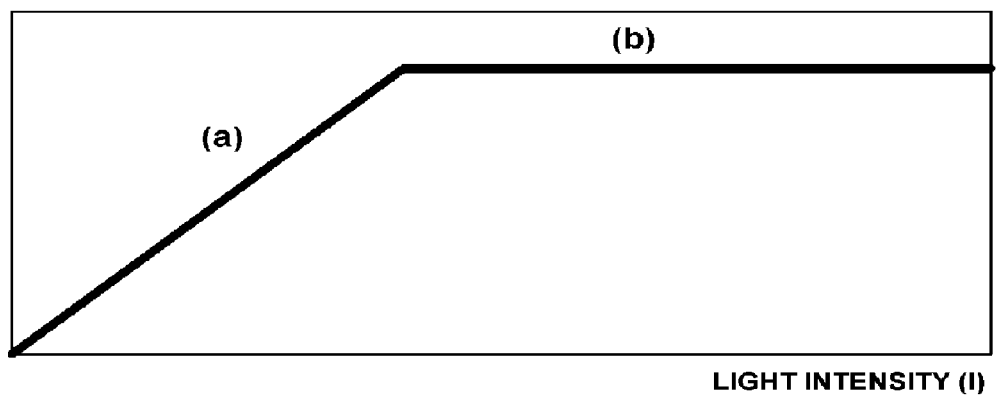
PRIOR ART  Fig. 4A
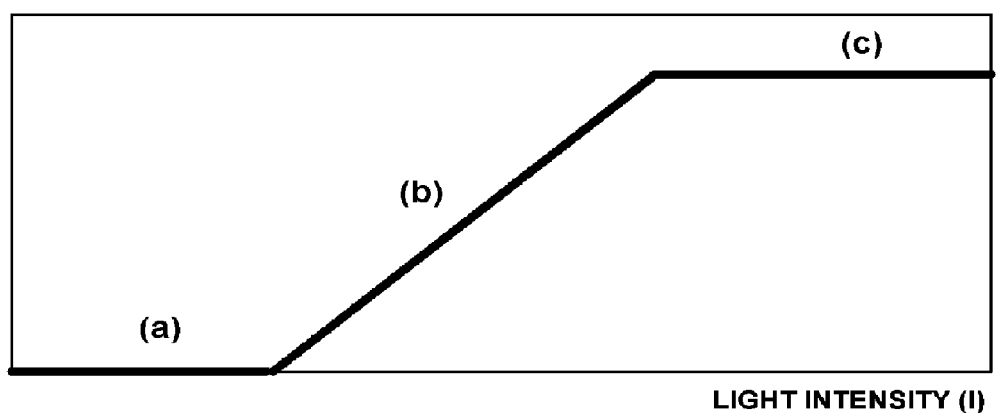
PRIOR ART  Fig. 4B
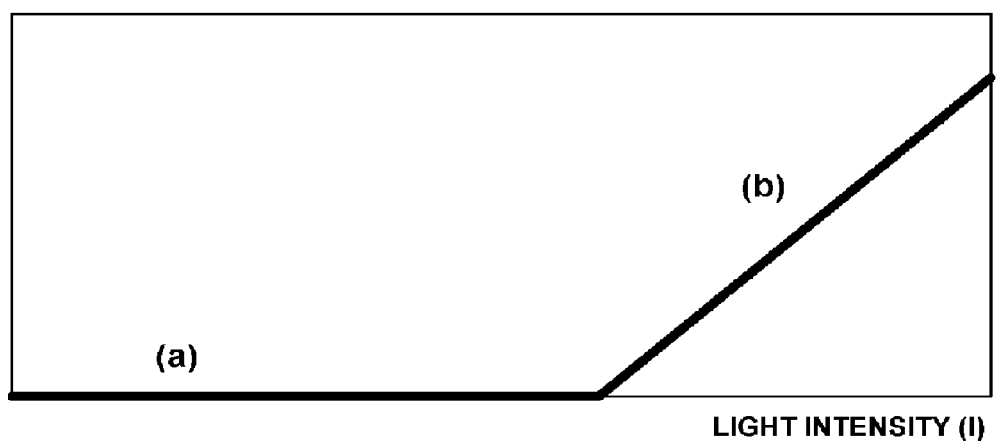
PRIOR ART  Fig. 4C

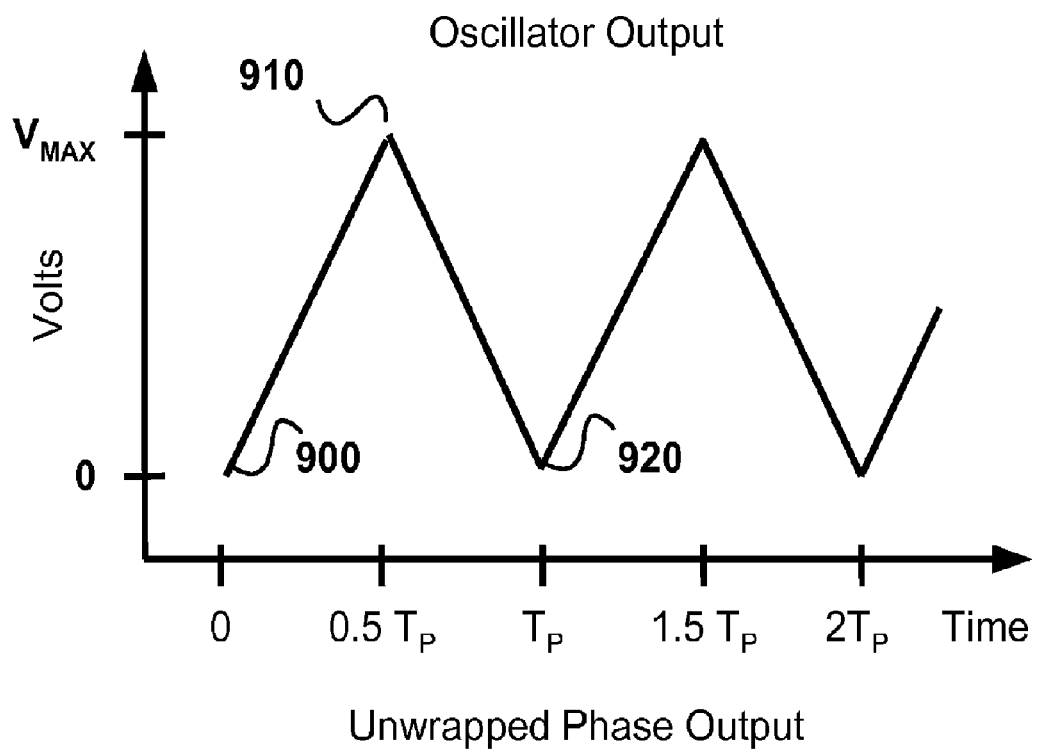
Figure 14A
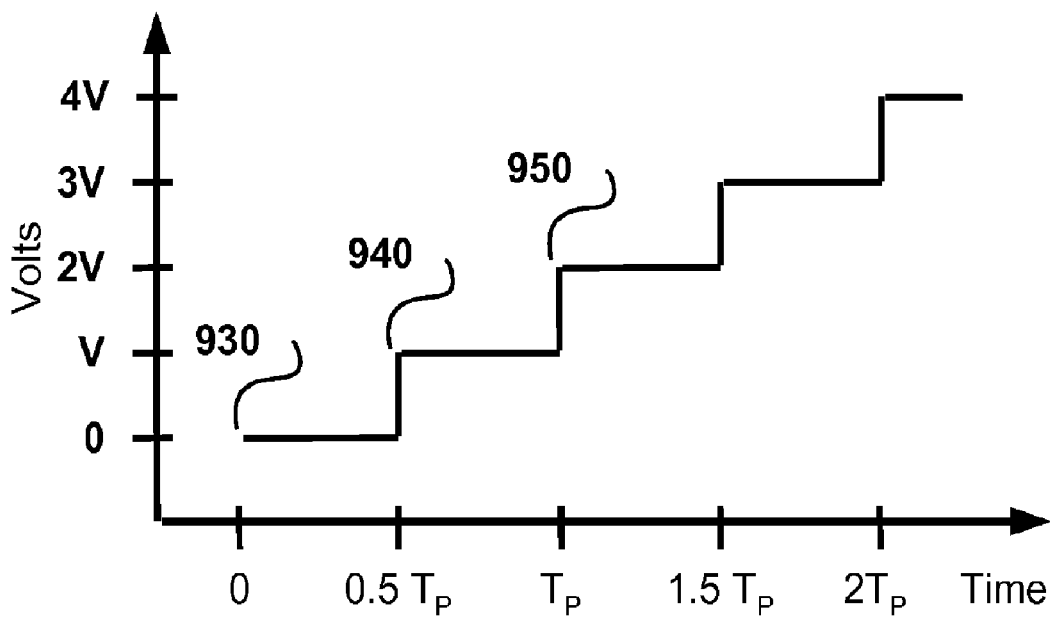
Figure 14B Phase unwrapping

SYSTEM AND METHOD FOR A HIGH DYNAMIC RANGE SENSITIVE SENSOR ELEMENT OR ARRAY WITH GAIN CONTROL

CROSS REFERENCE TO RELATED APPLICATIONS

This application claims priority under 35 U.S.C. §1.119(e) to provisional patent application Ser. Nos. 60/719,306, 60/719,304 and 60/719,305 filed on Sep. 21, 2005 by Davidovici et al, and to provisional patent application Ser. No. 60/727,897 filed Oct. 18, 2005 by Davidovici et al. All of the above identified priority applications are incorporated herein by reference.

FIELD OF THE INVENTION

This invention relates generally to the field of electronic imaging and more particularly to a method and apparatus for enhanced image capture using photometric measurement and reporting.

BACKGROUND OF THE INVENTION

Photography is the process of making pictures by means of the action of light. Light is the commonly used term for electromagnetic radiation in a frequency range that is visible to the human eye. Light patterns reflected or emitted from objects are recorded by an image sensor through a timed exposure. Image sensors can be chemical in nature, such as photographic film, or solid state in nature, such as the CCD and CMOS image sensors employed by digital still and video cameras.

Digital cameras have a series of lenses that focus light to create an image of a scene. But instead of focusing this light onto a piece of film, as in traditional cameras, it focuses it onto the image sensor which converts the electromagnetic radiation of the light into an electrical charge. The image sensor is said to be a picture element, or a 'pixel.' The electrical charge indicates a relative intensity of the electromagnetic radiation as perceived by the image sensor, and generally is used to associate a light intensity value with the pixel.

FIG. 1 illustrates typical component blocks that may be included in a digital image processing system 10. The system 10 includes a signal source 100 and a signal processing chain that consists of integrator 110, analog to digital converter (ADC) 120 and DSP 130. Signal source 100 could for example be a sensor such as a light intensity sensor that generates an electrical response in response to electromagnetic radiation, such as light, impinging upon it.

The output of integrator 110, $V_{OUT}$, is input to ADC 120. ADC 120 performs the analog to digital conversion function. The analog to digital conversion function is well known in the art. The analog signal $V_{OUT}$ present at ADC 120 input is converted into signal $V_D$ that can take one of a set of discrete levels.

The quality of the signal is improved by integrator 110 which integrates the signal $V_{IN}$. FIG. 2 illustrates the nature of the signal improvement. Waveform 200 is the combination of a constant value signal generated by signal source 100 and additive noise that corrupts the constant value signal. Waveform 210 is the integrator output generated in response to input signal waveform 200. It is readily observed that signal fluctuations caused by the additive noise decrease in waveform 210.

Signal source 100 could be a light intensity sensor that is used in a timed application, such as in a digital camera application where the sensor is exposed to the light for a specific duration of time, commonly referred to as the exposure time. The integrator 110 then also serves the function of integrating the response of sensor 100 caused by all photons received during the exposure time into one value, such as for example a voltage, to be read-out at the end of the exposure time.

FIG. 3 illustrates a typical image sensor circuit. Signal source 1000 is a light sensor that by way of example can be said to be a photodiode. Capacitor 1040 is a simple integrator. The input to the integrator is the output of signal source 1000. Capacitor 1040 is reset by switch 1050 which is in the closed position prior to starting the integration process. At the start of the integration process switch 1050 opens and the voltage across capacitor 1040 begins to change in response to the input signal originating from signal source 1000. At the end of the integration process switch 1030 closes and integrator output 1060, $V_{OUT}$, is sampled. FIG. 3 is an illustrative diagram. The implementation of other similar integrators with identical functionality is well known to one skilled in the art.

Integrator output 1060, $V_{OUT}$, cannot in general exceed the upper limit imposed by the available power supply voltage. Power supply voltages are decreasing in state-of-the-art equipment due to stringent power consumption requirements. Integrator output 1060 cannot exceed the power supply voltage and will saturate if the integrator output signal continues to build after reaching the power supply voltage level. The saturation condition is illustrated in FIG. 4A. Saturation occurs when the output voltage reaches the available power supply voltage and is unable to respond to further changes in the input signal. Signal saturation causes system performance degradation. FIGS. 4A through 4C illustrate potential distortions at the output of a pixel structure consisting of light sensor 100 and integrator 110 due to dynamic range limitation of the photosensitive element structure and more specifically of the integrator structure.

Segment (a) of FIG. 4A illustrates the linear increase of integrator 110 output in response to a constant input signal of different level. The image sensor structure will perform well for the range of input light intensities that give rise to the linear output of segment (a); the image sensor structure will not perform well for the range of input light intensities that give rise to the saturated output of segment (b).

The integrator output response is indicative of limited dynamic range. As illustrated in FIG. 4A the image sensor will render well shadow detail but will fail to render highlight detail. It is possible to shift the response as illustrated FIGS. 4B and 4C. In FIGS. 4B and 4C the dynamic range of the image sensor remains the same but the response characteristic is shifted. The response characteristic of FIG. 4B loses shadow and highlight detail but retains good midrange response. The response characteristic of FIG. 4C loses shadow detail and partial midrange detail in order to maintain good highlight detail.

FIG. 5A illustrates the histogram of the pixel intensities of an overexposed image capture where a multitude of pixels were driven into saturation, such as in FIG. 4A. As seen in FIG. 5A the maximum pixel structure output value is '255' and the units used are the ADC 120 output corresponding to the pixel output voltage. The light intensity caused many light sensors 100 to output a value that saturated the integrator 110 as the exposure progressed during the exposure period. The maximum (saturated) value of the integrator 110 output caused the ADC to generate the output code '255' which is the maximum output code for an 8-bit ADC. The image capture will be of lower than optimal quality due to the inability of those pixels subject to high intensity light inputs to achieve a sufficiently high output level. A lower integrator 110 gain would have caused the outputs of the light image sensor subject to high intensity light inputs to register a below-255 output and avoid the high end distortion.

FIG. 5B illustrates the histogram of the pixel intensities of an underexposed image capture where a multitude of pixels were not exposed to sufficient light to achieve a minimum output value. As seen in FIG. 5B the minimum pixel structure output value is '0' and the units used are the ADC 120 output corresponding to the pixel output voltage. The light intensity caused many light sensors 100 to output a value that failed to cause integrator 110 to output a sufficiently high value to cause a minimal ADC output code as the exposure progressed during the exposure period.

The image capture will be of lower than optimal quality due to the inability of those pixels subject to low intensity light inputs to achieve a sufficiently high output level. The distortion illustrated in the histogram of FIG. 5B corresponds to the individual pixel distortion of FIG. 4C. A higher integrator 110 gain would have caused the outputs of the light image sensor, subject to low intensity light inputs, to register an above-zero output and avoid the low end distortion.

FIG. 6 illustrates the response curve of a pixel structure built using double-slope technology. The nonlinear extension of dynamic range illustrated in FIG. 6 avoids saturation effects; however, the non-linear relationship between the intensity of the electromagnetic energy impinging upon the sensor and the sensor's output causes the image to be captured with reduced resolution when high levels of light intensity are present.

Other approaches such as multiple exposure combining, conditional slope switching and logarithmic response pixel structures have been published. The multiple exposure combining, conditional slope switching and logarithmic response pixel structures exhibit performance degradations that render them unsuitable for high performance image acquisition tasks.

Integrator saturation is the limiting factor in the dynamic range performance of a pixel structure. Solutions to the integrator saturation problem have been published. One feature the published solutions have in common is the monitoring of the integrator output to detect the onset of saturation condition at which time the integrator is discharged and the event is recorded. This class of solutions is difficult to implement efficiently in integrated circuits (ICs) due to accuracy requirements of analog components and non-standard analog implementations. The implementation of accurate comparators that operate in a noisy environment near the power supply voltage, where integrator outputs begin to saturate, is a difficult undertaking that consumes excessive power, an undesirable operational feature.

Analog IC designs are difficult and time consuming to implement. It is advantageous to use standard building blocks that have been fully debugged and optimized for size, power consumption and performance. The class of published solutions does not meet this requirement.

SUMMARY OF THE INVENTION

According to one aspect of the invention, a method for obtaining a high dynamic range read-out signal from a pixel structure includes the steps of applying a gain to an input signal provided by a photosensitive element of a pixel structure, wherein the gain is related to a feedback of the pixel structure.

According to another aspect of the invention, a pixel structure includes a photosensitive element for generating a signal in response to electromagnetic radiation and a gain controller having an input coupled to a photosensitive element output and an output coupled to an integrator input.

With such an arrangement, a solid-state pixel is provided that is capable of producing a faithful reproduction of an image to be captured regardless of the intensity of electromagnetic energy impinging on the sensor and with dynamic gain adjustment capabilities. These and other advantages of the invention will be described with regard to the below figures.

BRIEF DESCRIPTION OF THE FIGURES

FIGS. 4A-4C are transfer curves provided to describe distortions at the output of a pixel structure such as that of FIG. 3, illustrating dynamic range limitations;

FIGS. 14A and 14B are graphs provided to illustrate a phase unwrapping mechanism of the present invention;

DETAILED DESCRIPTION

Phase Integration

According to one aspect of the invention, a high dynamic range sensitive sensor element or array is provided which uses phase domain integration techniques to accurately capture high and low intensity images. The sensor element of the present invention is not limited by dynamic range characteristics exhibited by prior art solid-state pixel structures and is thus capable of capturing a full spectrum of electromagnetic radiation to provide a high quality output image.

Figure 7A:
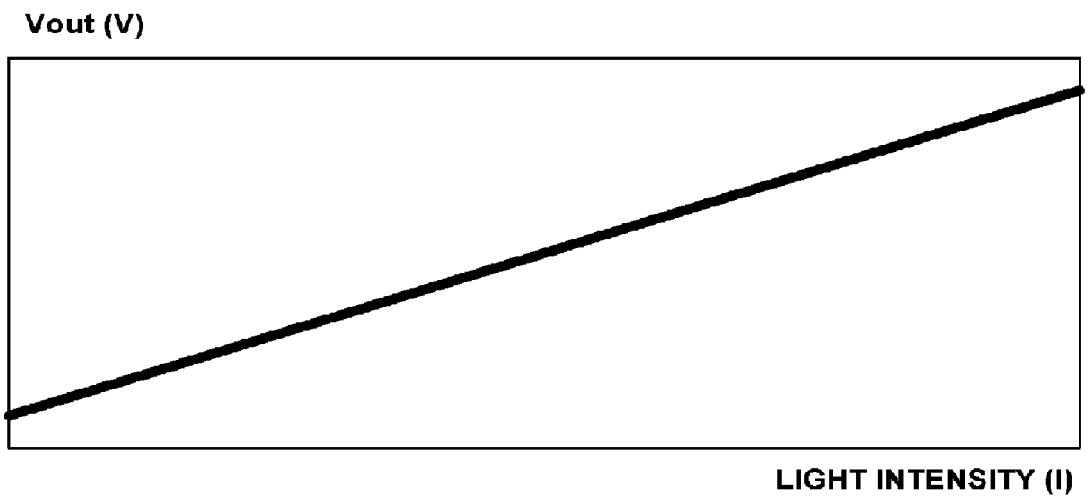
FIG. 7A is a response curve of a pixel structure of the present invention.

FIG. 7A illustrates the response of a sensor element built using the technology of the present invention. The extended dynamic range of the sensor element is sufficient to enable it to respond to impinging radiation with a pixel response over the full range of electromagnetic radiation intensity. As a result the sensor element is able to capture sufficient charges in the darkest portion while avoiding the saturation affects in the brightness portions of the image to be captured. The net effect it is faithful reproduction of the image to be captured regardless of the intensity of the electromagnetic energy impinging upon the sensor.

Figure 7B:
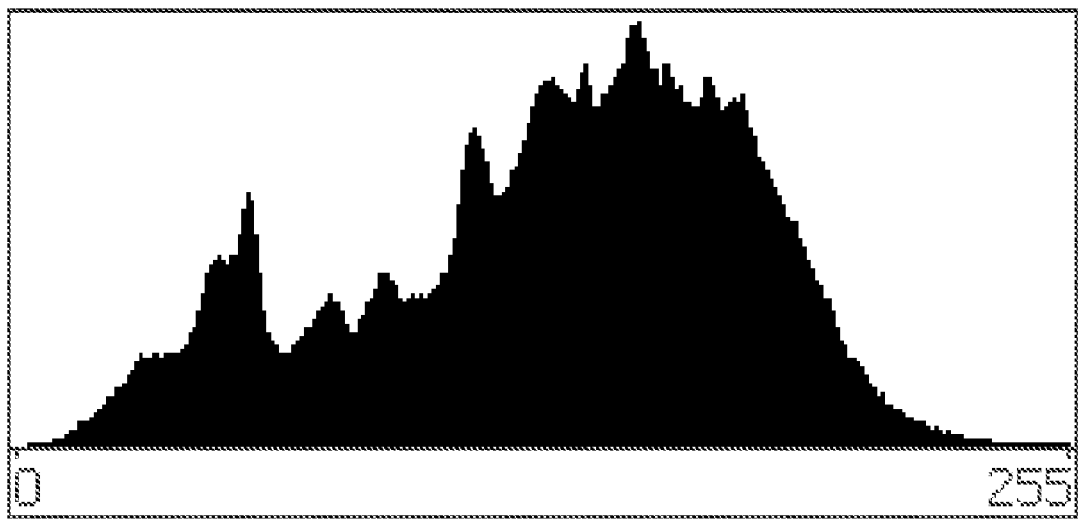
FIG. 7B illustrates an exemplary histogram of pixel intensities in a captured image of the present invention.

FIG. 7B illustrates the histogram of the pixel intensities of a correctly exposed image capture where all pixel outputs are within the dynamic range of the 8-bit ADC that is zero to 255.

The sensor element of the present invention includes a novel integrator implementation that is based on frequency oscillator circuits. Frequency oscillator circuits are standard IC component blocks and do not suffer the disadvantages of the prior art solid-state devices. Also, the novel sensor elements disclosed herein uses accurate integrators that can accommodate output signal values far in excess of available power supply voltages and with very high accuracy and dynamic range.

Figure 1:
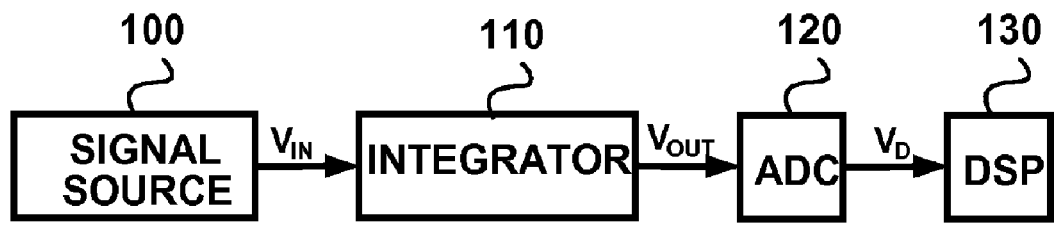
FIG. 1 is a block diagram illustrating exemplary components that may be included in an image sensor and associated processing chain.
Figure 2:
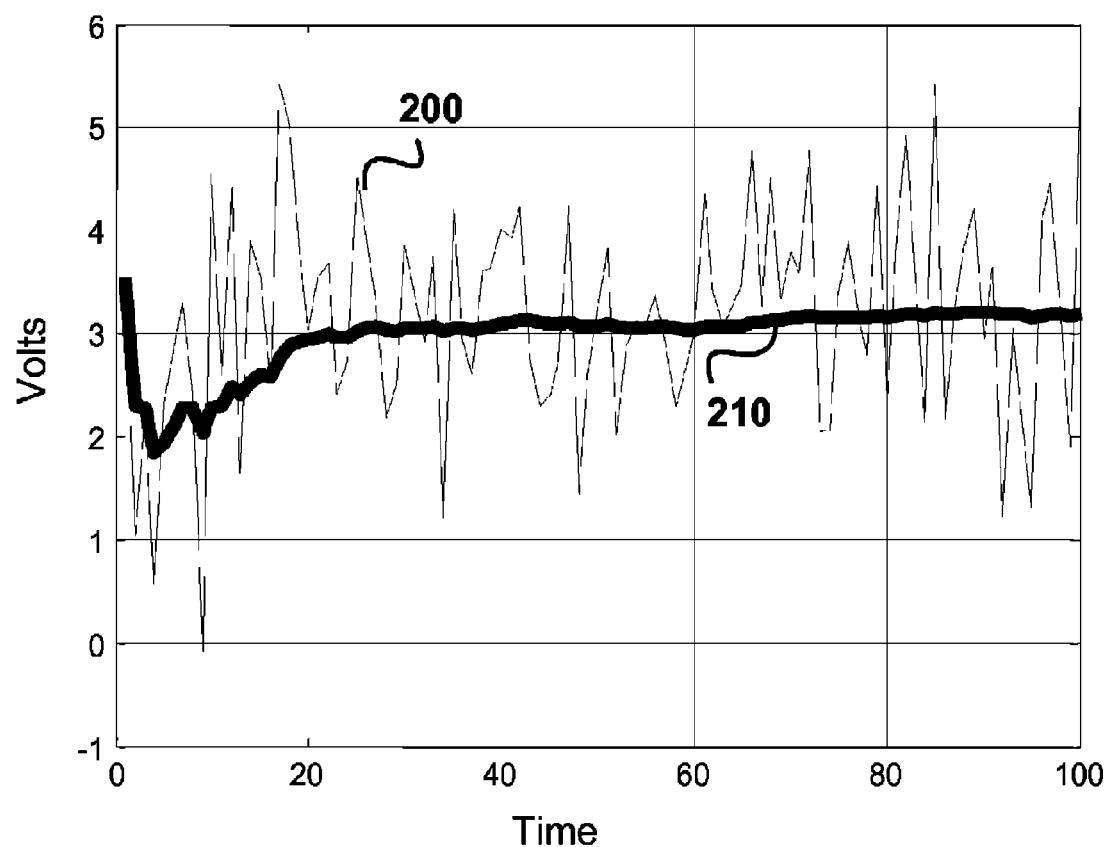
FIG. 2 is a graph illustrating the noise smoothing feature at the output of an integrator.
Figure 3:
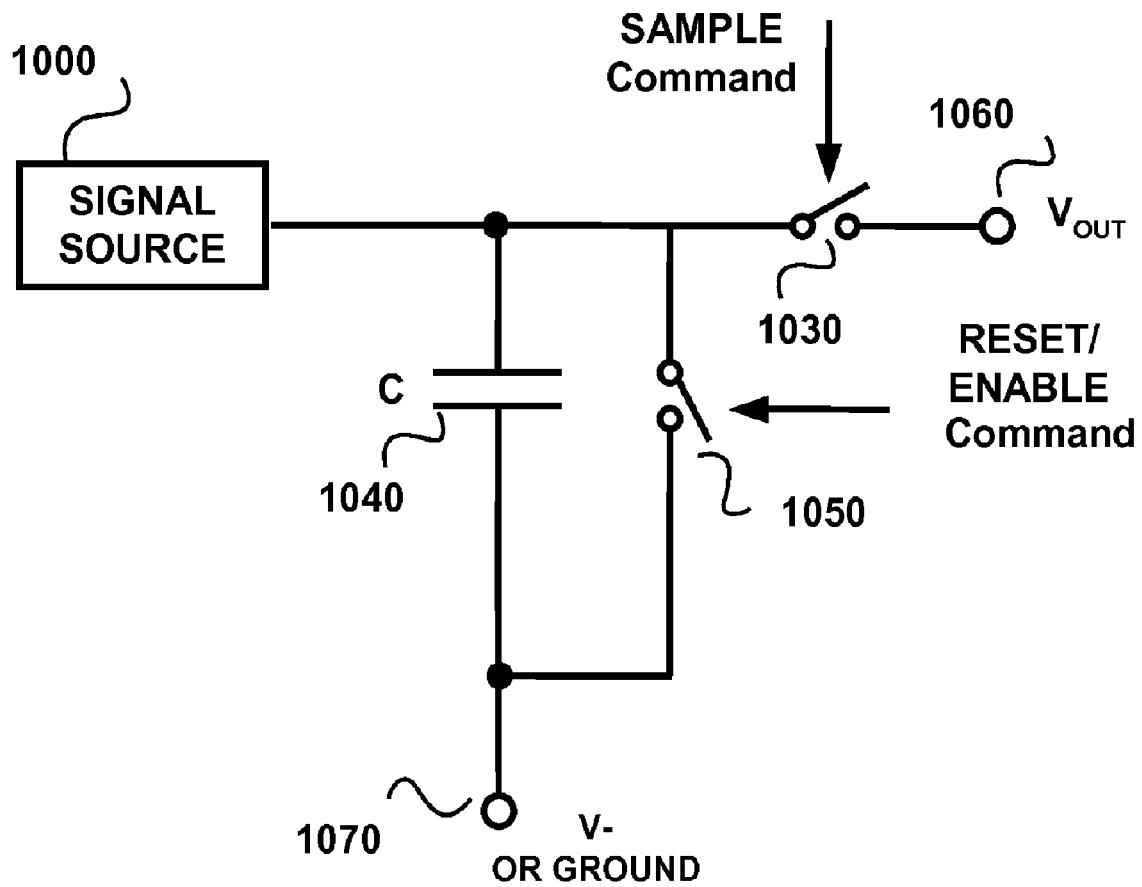
FIG. 3 is a block diagram of a typical pixel structure.
Figure 5A:
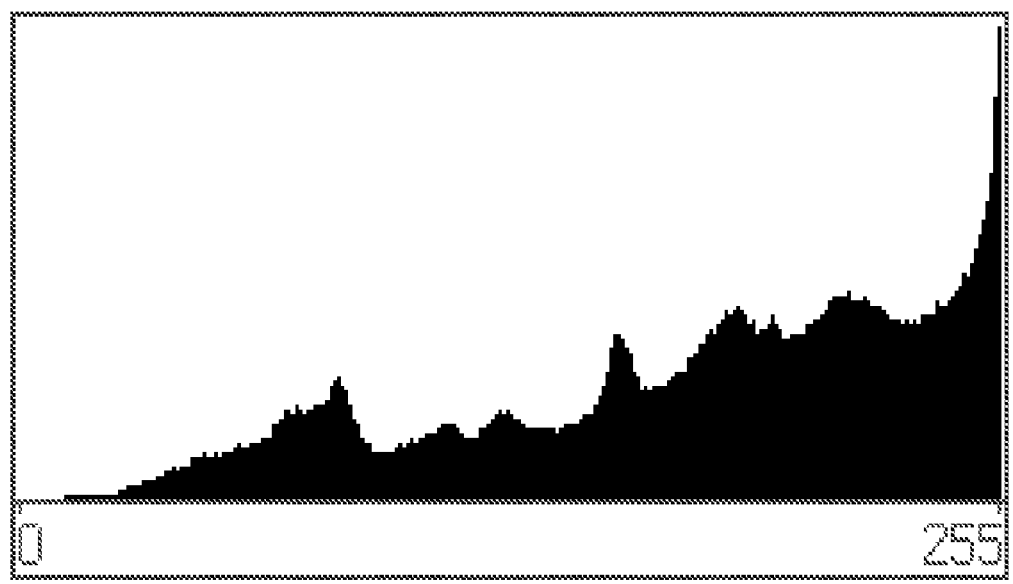
FIGS. 5A and 5B are histograms of pixel intensities of respective overexposed and underexposed image capture.
Figure 5B:
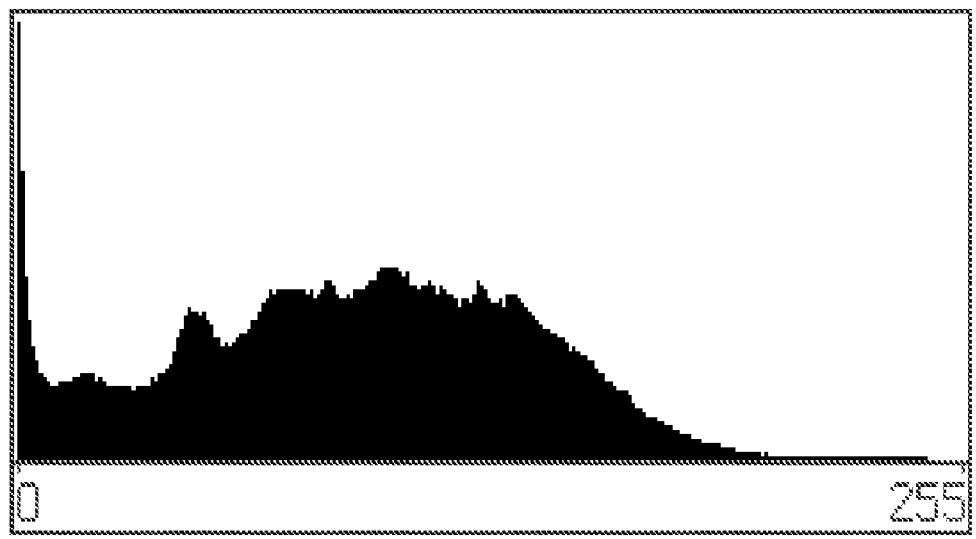
Figure 8:
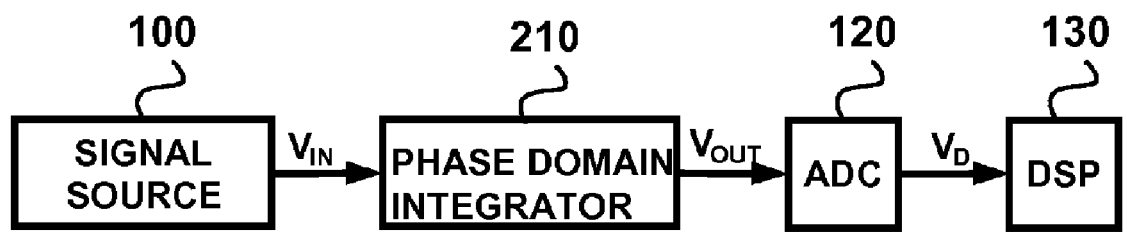
FIG. 8 is a block diagram illustrating exemplary components that may be included in an image sensor and associated processing chain, including a phase domain integrator.
Figure 9:
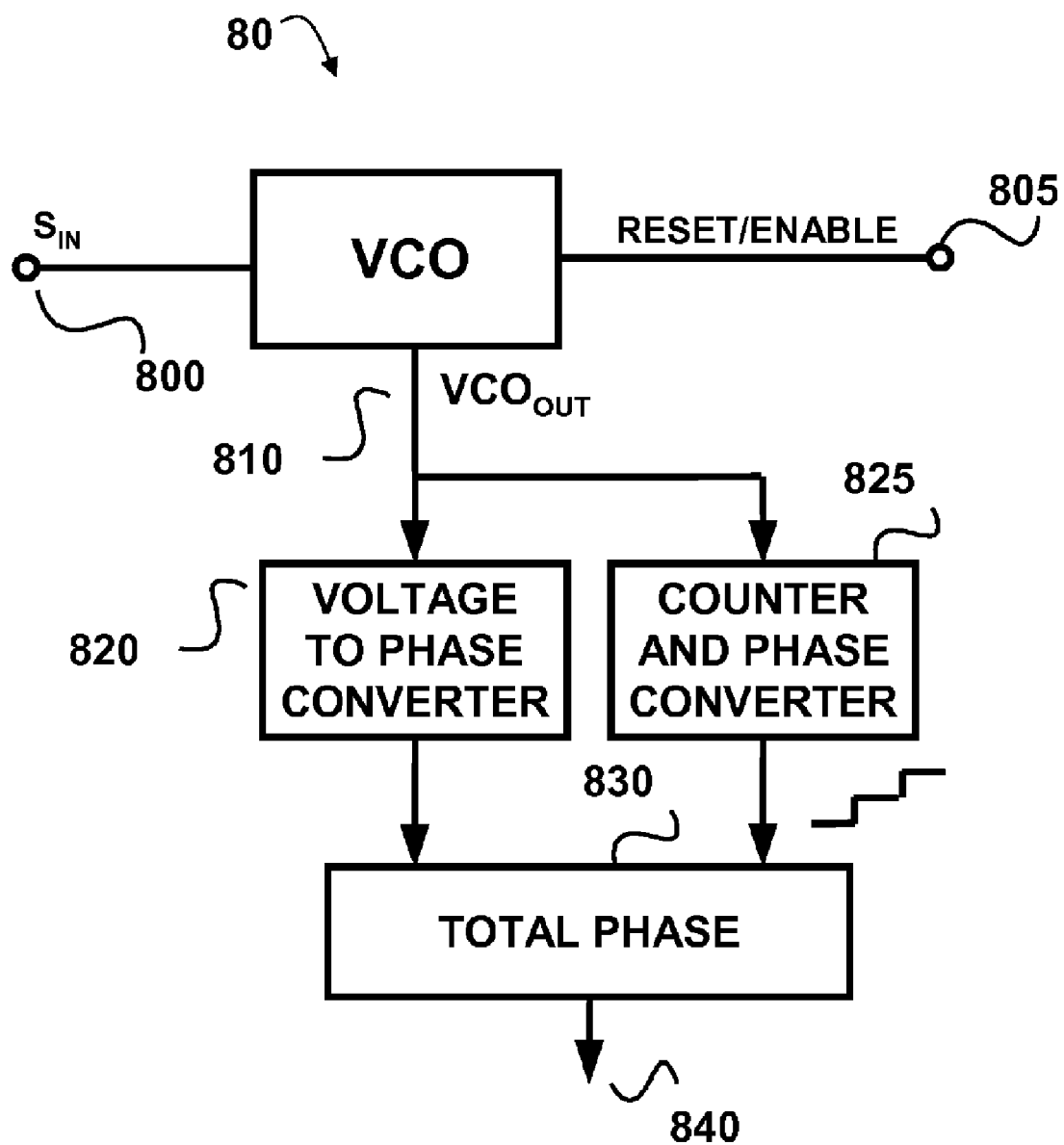
FIG. 9 is a block diagram of one embodiment of a phase domain integrator of the present invention.

For high performance image acquisition it is desirable to have image sensors capable of high resolution and high dynamic range image acquisition using a single sensor readout step. FIG. 8 illustrates an exemplary pixel structure of the present invention. The pixel structure of FIG. 8 uses the conventional signal acquisition structure of FIG. 3 but replaces the time domain integrator 110 with a novel phase domain integrator 210. FIG. 9 shows the phase domain integrator of the present invention in more detail.

In the present invention, the output of signal source 100 (FIG. 8) is connected to the input 800 of the phase domain integrator of FIG. 9. At the end of the integration period the integral of the input signal is read in phase format at the phase domain integrator output 840.

The image sensor assembly and specifically the integrator section satisfy two criteria: a) produce a large output in response to weak input signals from the light sensitive element and b) avoid saturation when the input signals from the light sensitive element are large. These two criteria are mutually exclusive in solid-state structures. However, the present invention realizes that the two criteria can be satisfied through the use of a phase domain integrator such as that of FIG. 9.

The operation of the phase domain integrator can best be fully understood by exploring the concepts of integration, phase and frequency and their interrelation. The integration function, or integral, is a mathematical function that is well known in the art. Briefly, an integral is a mathematical object that can be interpreted as an area or a generalization of area. If a signal is plotted as a curve, the integral of the signal is the area under the curve. An integrator is a device that integrates a signal present at its input and produces an integrated version of the input signal at its output.

Phase and frequency have a differential relationship. The total phase traversed by an oscillator output $V_{out}$ during a duration of time $\Delta T$ is mathematically given by $$\Delta\theta = \int f_{inst} dt = \int (f_{nom} + f_{gain} \cdot S_{in}) dt$$

where the integral limits are over the time duration $\Delta T$.

Separating the integral terms $$\Delta\theta = \int (f_{nom} + f_{gain} \cdot S_{in}) dt = \int f_{nom} dt + \int f_{gain} \cdot S_{in} dt = K + f_{gain} \cdot S_{in} dt$$

where the term K is a constant that is a function of the constant value $f_{nom}$ and $\Delta T$ (the integration time) and is therefore well known.

For the special case where $f_{nom}=0$ then K=0 and $$\Delta\theta = f_{gain} \cdot S_{in} dt.$$

The second term consists of a constant value multiplier $f_{gain}$ and the term $\int S_{in}$ dt which is the integral of the input signal $S_{in}$. The term $f_{gain} \cdot S_{in}$ dt can be easily obtained by subtracting the value of K from the $\Delta\theta$ value at the end of the time period $\Delta T$:

$$f_{gain} \cdot S_{in} dt = \Delta\theta - K \text{ and}$$

$$\int S_{in} dt = (\Delta\theta - K)/f_{gain}$$

For the special case $f_{nom}=0$ and therefore K=0

$$\int S_{in} dt = \Delta\theta/f_{gain}$$

Figure 10A:
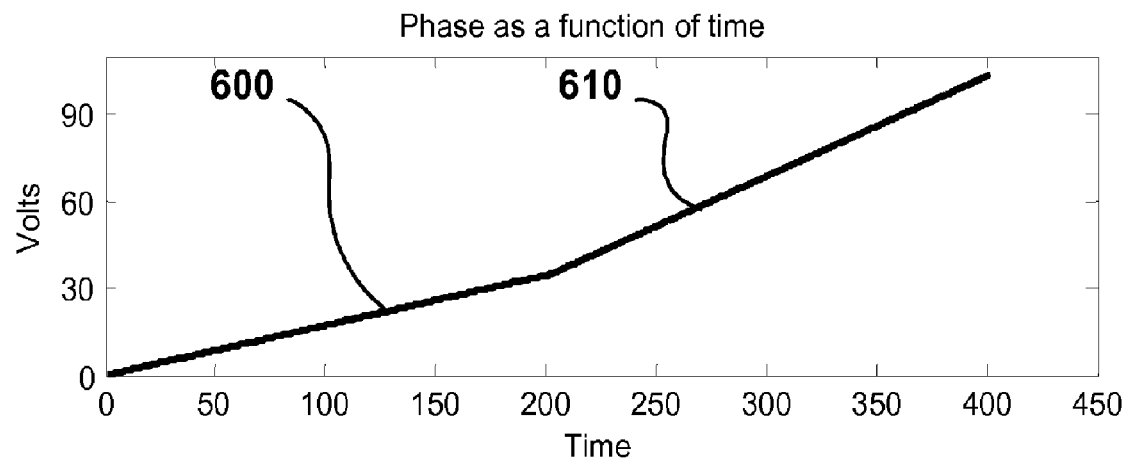
FIGS. 10A and 10B are graphs illustrating an oscillator phase (9A) and a time domain integrator output signal (9B), and is used to describe the signal integration capabilities of the present invention.
Figure 10B:
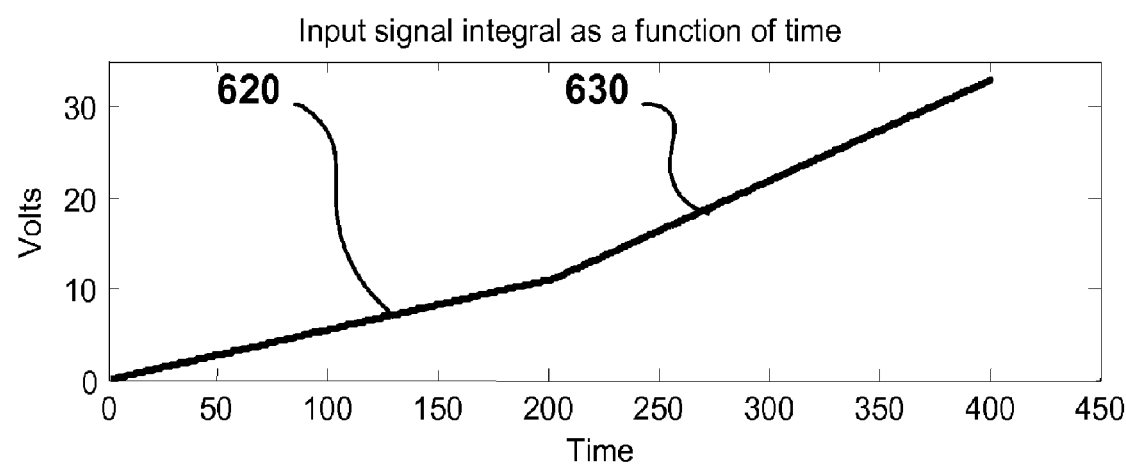

The relationship above establishes the differential relationship between the VCO control input signal $S_{in}$ and the phase $\Delta\theta$ traversed by the VCO or oscillator output during a period of time $\Delta T$. FIGS. 10A and 10B illustrate this equivalence graphically. FIG. 10A plots the phases traversed by the VCO output as a function of time. FIG. 10B plots the integral with respect to time of the input control signal $S_{IN}$.

Figure 11A:
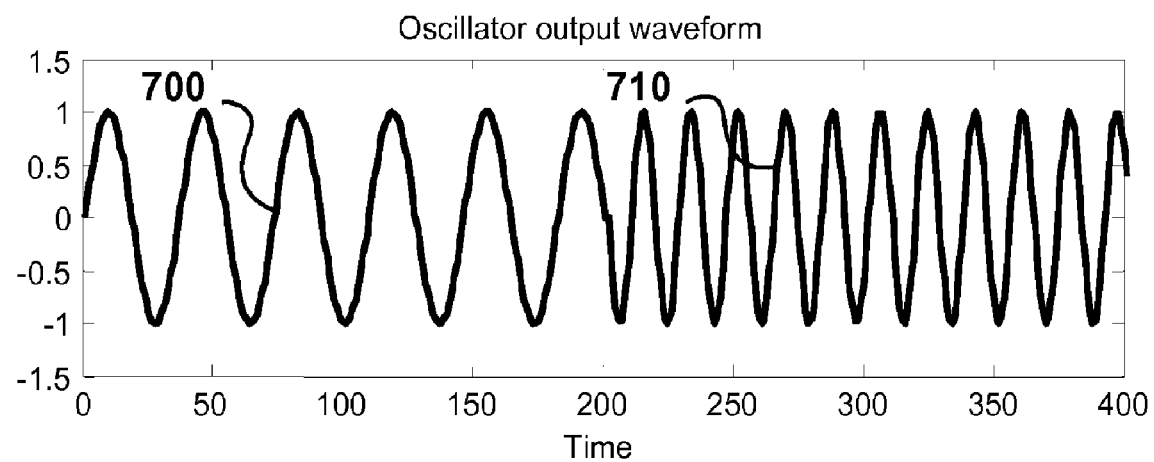
FIG. 11A is a graph which illustrates an oscillator waveform that varies in frequency in response to an oscillator input illustrated in FIG. 11B.
Figure 11B:
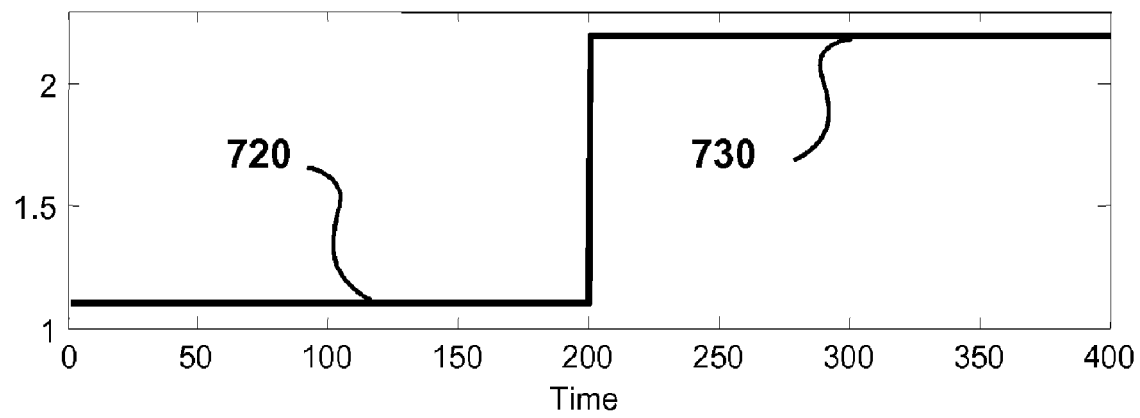

FIG. 11A illustrates a voltage controlled oscillator output waveform generated in response to an input signal $S_{IN}$ illustrated in FIG. 11B. $S_{IN}$ is comprised of two constant value segments, the first segments labeled 720 in FIG. 11B being lower in value than the second segments, labeled 730 in FIG. 11B.

Referring back to FIG. 10B, integrator output segment 620 is the integral output as a function of time when the lower value $S_{IN}$ segment 720 was input to the integrator. Integrator output segment 630 is the integral output as a function of time when the higher value $S_{IN}$ segment 730 was input to the integrator.

The lower value $S_{IN}$ segment 720 caused the VCO to oscillate at a lower frequency than the higher value $S_{IN}$ segment 730. Waveform segment 700 in FIG. 11A illustrates the lower VCO oscillation frequency. The higher value $S_{IN}$ segment 730 at the VCO input causes the VCO to oscillate at a higher frequency than the lower value $S_{IN}$ segment. Waveform segment 710 in FIG. 11A illustrates the higher VCO oscillation frequency.

FIG. 10A plots the phases traversed by the VCO as a function of time. Segment 600 corresponds to VCO output segment 700. Segment 610 corresponds to VCO output segment 710. Segment 600 indicates a lower phase accumulation rate than segment 610. The phase accumulation rate is the integral of the phase traversed by the VCO per unit of time and can be expressed in units of radians per second. The velocity with which the VCO traverses a unit of phase is the frequency of oscillation and is also expressed in units of radians per second.

The VCO control signal input waveform segment 720 causes the VCO to output waveform segment 700. The plot of the VCO output phase as a function of time generates the curve segment 600.

The VCO control signal input waveform segment 730 causes the VCO to output waveform segment 710. The plot of the VCO output phase as a function of time generates the curve segment 610. The waveforms plotted in FIGS. 9a and 9b are identical in shape and are related by the constant $f_{gain}$ when $f_{nom}=0$ and therefore K=0; when $f_{nom}\neq0$ and therefore K≠0 the waveforms plotted in FIGS. 10A and 10B are related by the constants $f_{gain}$ and K.

Accordingly it is realized that the time domain integral of the input signal $S_{IN}$ is therefore functionally equivalent to the phase domain integral of the input signal $S_{IN}$. The time domain integral of the input signal $S_{IN}$ and the phase domain integral of the input signal $S_{IN}$ are related through two constants, one of which equals zero for the special case $f_{nom}=0$.

The use of the method disclosed herein to perform signal integration has advantages over conventional integrators and resolves difficult performance issues associated with conventional integrators. One advantage is the resolution of the potential to saturate the integrator output. VCO or oscillator outputs are strictly bound by upper and lower limits (peak values) which are not exceeded under any circumstances. Therefore output saturation conditions cannot occur.

Figure 12:
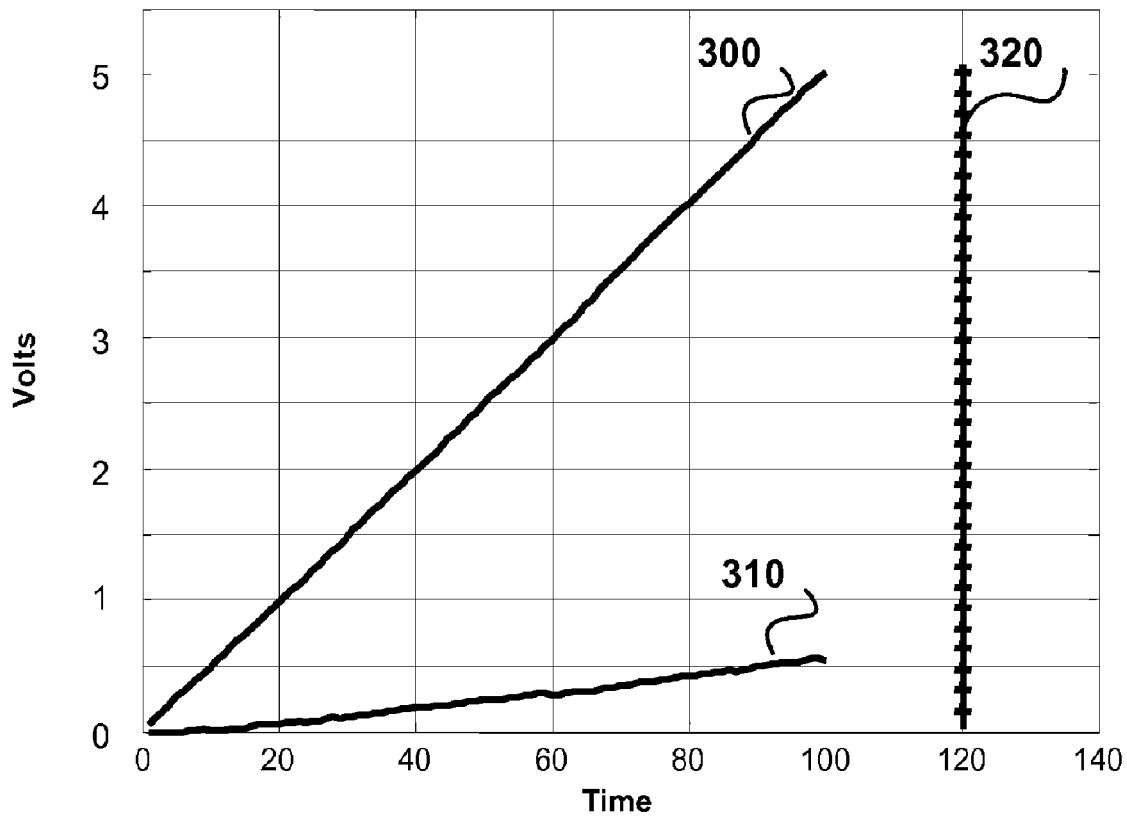
FIG. 12 is a graph illustrating the affects of quantization error on low intensity signals.

Another advantage is the resolution of the issue of quantization noise. As illustrated in FIG. 12 low level signal 310 could suffer from significant and unacceptable quantization noise, with little distinction between output voltages generated by input intensities close in value. Phase measurement based integration measures the phase traversed by the oscillator output Δθ during integration time ΔT. The phase traversed by the oscillator output Δθ during integration time ΔT is proportional to the integral of the input control signal during integration time ΔT and the two are proportional. The minimum Δθ value occurs for the smallest integral output. But $$f_{gain}\cdot\int S_{in}dt=\Delta\theta-K$$

where K is a constant. Therefore Δθ−K can be independently set to a specific value for any given value of $\int S_{in} dt$, including its minimum, by simply adjusting the VCO gain $f_{gain}$. The ability to set the gain of the integrator and hence the minimum value of the measured integrator output variable eliminates the quantization noise issue associated with conventional integrators.

Yet another advantage is that variable oscillator circuits are common and fundamental building blocks of a wide variety of systems. Therefore they are widely available and have been highly optimized.

Thus VCO-based integrators are far superior to conventional integrators in quantization noise and dynamic range or lack of output saturation. Other advantages exist and are apparent to one versed in the art.

Oscillators are a class of circuits well known in the art. The output of oscillator circuits can have a variety of shapes but they are all periodic, meaning that the output waveform is repetitive. One repetition of the output waveform comprises one oscillation cycle and the duration of a cycle is defined as its period of oscillation.

The frequency of oscillation, $f_{osc}$, is defined as the number of periods of oscillation per unit time and it is usually measured in Hertz (periods of oscillation per second). By convention the angular frequency of an oscillator is defined as $\omega=2\pi f_{osc}$ and one complete cycle of oscillation traverses a phase angle θ of 2π radians.

Associated with an oscillator are initial conditions, that is the state of the system at some arbitrary time, t=0. An example of an initial condition might be the initial phase of the oscillator at t=0 measured in radians.

Figure 13A:
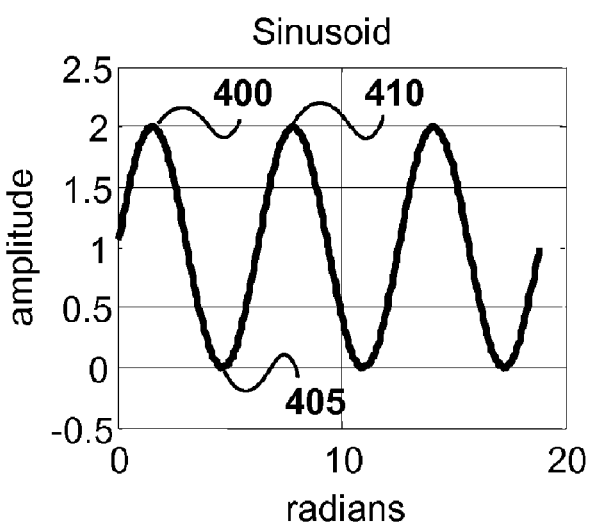
FIGS. 13A-13D illustrate several common VCO output waveforms.
Figure 13B:
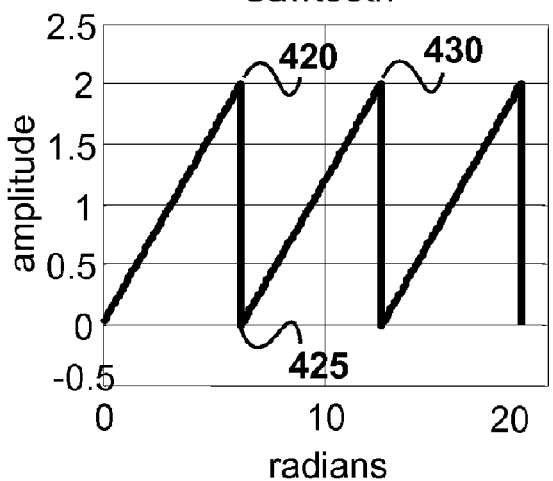
Figure 13D:
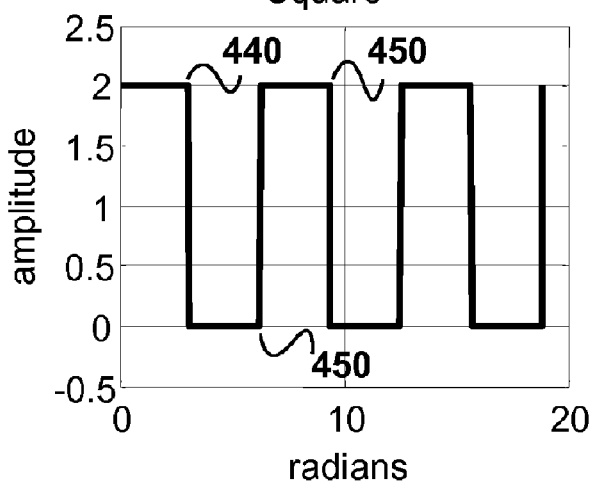
Figure 13C:
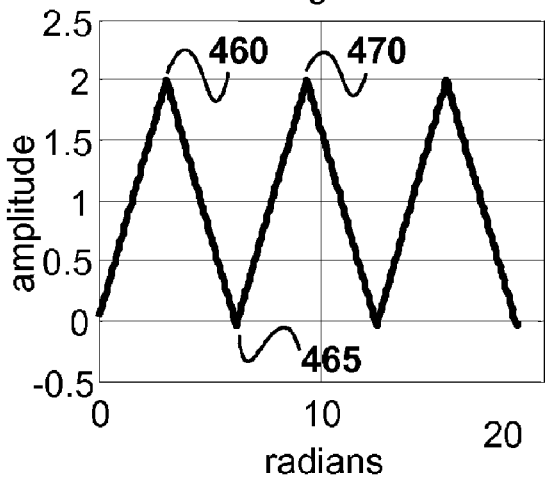

FIGS. 13A, B, C and D illustrate common output waveforms of oscillator circuits. As well known in the art FIGS. 13 A, B, C and D illustrate the output waveform of sinusoidal, triangular, sawtooth and square wave oscillators. In all cases the peak voltage range shown is one volt.

The frequency of oscillation of electronic oscillator circuits can be fixed or variable. A common oscillator with variable frequency of oscillation is the voltage-controlled oscillator (VCO). At a minimum a VCO has a voltage input at which a signal voltage $S_{in}$ controls the frequency of oscillation. Voltage relates to current through Ohm's law and a signal $S_{in}$ can be said to control the frequency of oscillation through its current rather than voltage characteristic.

A VCO may also have a nominal frequency of oscillation $f_{nom}$. The VCO oscillates at $f_{nom}$ when the frequency control input $S_{in}$ level is not present or of a value that does not modify the frequency of oscillation, such as for example zero volts. The nominal frequency of oscillation can have any specified value including zero Hertz.

The output frequency of the VCO changes in response to amplitude variations of the input signal. Thus the instantaneous frequency of oscillation of the VCO will differ from the nominal frequency of oscillation of the VCO by some value $f_{delta}$ and will be given by $$f_{inst}=f_{nom}+f_{delta}$$

where $$f_{delta}=f_{gain}\cdot S_{in}.$$

In this example the term $f_{delta}$ is measured in radians per second, $f_{gain}$ is measured in radians per second per volt and $S_{in}$ is measured in volts.

As described above, FIG. 11A illustrates the input and output signals of a VCO. The frequency of oscillation of the VCO output changes in response to variations in the input signal amplitude. The VCO output segment 700 corresponds to input signal segment 720. The VCO output segment 710 corresponds to input signal segment 730. The frequency of oscillation of VCO output segment 700 is lower than the frequency of oscillation of VCO output segment 710. The amplitude of input signal segment 720 is lower than the amplitude of input signal segment 730. Therefore $f_{gain}$ has a positive value and the VCO frequency of oscillation is directly proportional to the input control signal amplitude.

A VCO may also have additional inputs, such as RESET/ENABLE. The function of RESET/ENABLE when in the RESET state is to reset the VCO output waveform to a predetermined voltage that can be any value within the peak-to-peak voltage range. The function of RESET/ENABLE when in the ENABLE state is to enable the VCO output to oscillate.

A VCO has an output $V_{out}$. During each period of oscillation $V_{out}$ traverses an angular phase of 2π radians. This implies that the output phase is measurable modulo 2π and oscillator output values at phases that are separated by exactly 2π are identical. FIGS. 13A-12D illustrates several common VCO output waveforms. During a complete period each waveform in FIG. 13 traverses exactly 2π radians and waveforms values at phases that are separated by exactly 2π are identical for all waveforms.

The phase traversed by the oscillator output during a subset of one period is determined by sampling the oscillator output at the two instances of time marking the beginning and end of the subset of one period, identifying the phase associated with each sample and subtracting the two phases.

The phase traversed by the oscillator output during a duration of time that spans more than one period of oscillation can only be determined modulo 2π radians when using a method based on direct observation of the VCO output at two time instances. Thus an additional function is used that counts the number of periods or significant fractions of a period traversed by the VCO output in order to resolve the ambiguity.

A circuit that counts the number of periods or significant fractions of a period traversed by the VCO output in a time interval, or 'unwraps' the phase, can be readily implemented. Waveforms associated with such a circuit are illustrated in FIGS. 14A and 14B. The VCO output in FIG. 14A is the triangular waveform. At times t=0, $0.5T_P$ and $T_P$ the VCO output waveform reaches states labeled 900, 910 and 920 corresponding to a travel of 0, $\pi$ and $2\pi$ radians.

The output of the phase unwrapping circuit changes states at times t=0, $0.5T_P$ and $T_P$ to levels of 0, V and 2V amplitude. The transition times are labeled 930, 940 and 950 and they correspond to the VCO output states labeled 900, 910 and 920, respectively.

The relationship between the VCO output and the output of the phase unwrapping circuit, illustrated over one period of the VCO output, can be extended over any number of VCO output periods with the output of the phase unwrapping circuit increasing in value by a predetermined amount each time the VCO output goes through its 0 and $\pi$ (modulo $2\pi$) phase values. It is known to one skilled in the art that there are alternative ways to implement the phase unwrapping function and mark the value of the unwrapped phase traversed by the VCO output.

The total phase traversed by the VCO output is given by the summation of two terms. The first term is the total unwrapped phase recorded by the phase unwrapping circuit. The second term is the total phase traversed by the VCO output since the last update of the phase unwrapping circuit output. This quantity can be unambiguously obtained by direct measurement of the VCO output.

Figure 15:
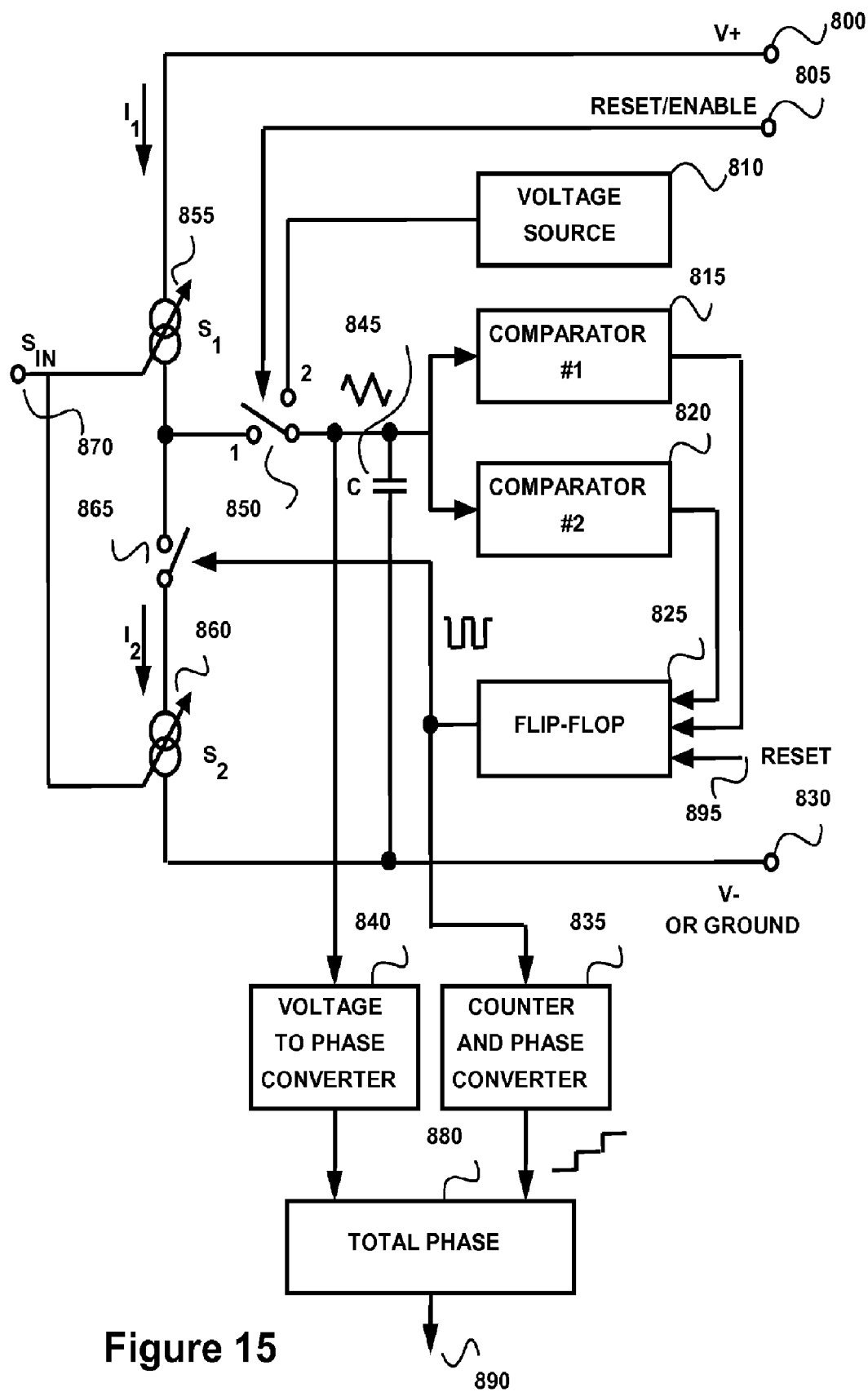
FIG. 15 is a block diagram of a phase domain integrator component of the sensor element of the present invention.

FIG. 15 incorporates a simplified block diagram of the VCO subset of ICL8038 a commercially available IC. Additional phase unwrapping, total phase traversed and VCO RESET/ENABLE functions are added.

Current sources 860 and 855 charge and discharge, respectively, capacitor 845. The charging and discharging of capacitor 845 is determined by switch 865 which is controlled by flip-flop 825 and which connects current source 860 or 855 to capacitor 845.

Flip-flop 825 changes states when triggered by comparators 815 and 820. Comparator 815 is triggered when capacitor 845 reaches a predetermined high voltage. Comparator 820 is triggered when capacitor 845 reaches a predetermined low voltage.

When comparator 815 is triggered flip-flop 825 changes state such as to cause switch 865 to close. Current $I_2$ of current source 860 causes capacitor 845 to discharge thus causing the voltage across capacitor 845 to decrease. The decrease of the voltage across capacitor 845 immediately causes comparator 815 to change state.

When the voltage across capacitor 845 decreases to a sufficiently low value comparator 820 is triggered. When comparator 820 is triggered flip-flop 825 changes state such as to cause switch 865 to open. Current $I_1$ of current source 855 causes capacitor 845 to charge thus causing the voltage across capacitor 845 to increase. The increase of the voltage across capacitor 845 immediately causes comparator 820 to change state.

When the voltage across capacitor 845 increases to a sufficiently high value comparator 815 is again triggered causing flip-flop 825 to change state and capacitor 845 charge/discharge cycle to repeat.

The relationship between the charge held by capacitor 845 and the voltage across capacitor 845 is $Q=C \cdot V$ where C is the capacitance of capacitor 845 measured in Farads, Q is the charge held by capacitor 845 measured in Coulombs and V is the voltage across capacitor 845 measured in Volts.

The change in charge held by capacitor 845 due to a constant current I that flows for an interval of time $\Delta T$ is given by $\Delta Q = I \cdot \Delta T$ where $\Delta Q$ is the change in charge held by capacitor 845 in Coulombs, I is the value of the current in Amperes and $\Delta T$ is the interval of time of current flow in seconds. A constant current causes a linear change in the charge held by capacitor 845 as a function of time. The linear change in the charge held by capacitor 845 as a function of time causes a linear change in voltage across capacitor 845 as a function of time.

Figure 6:
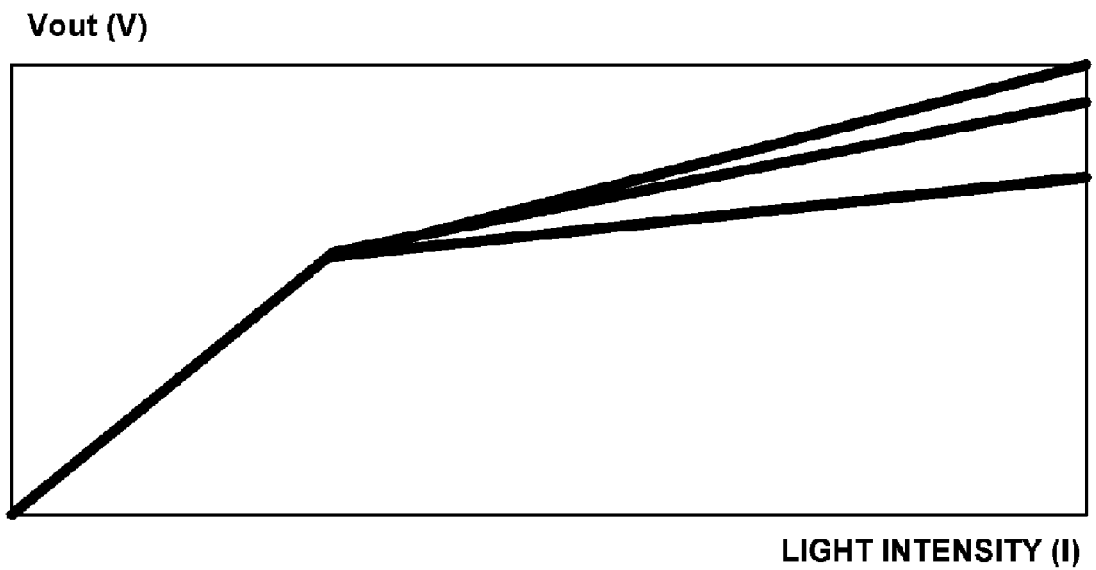
FIG. 6 is a response curve of a pixel structure built using double-slope technology.

The constant value of currents $I_1$ and $I_2$ generated by current sources 855 and 866 cause the voltage across capacitor 845 to increase and decrease linearly generating a triangular waveform. If the net effects of currents $I_1$ and $I_2$ are equal the rising and falling segments of the triangular voltage waveform across capacitor 845 are symmetric as illustrated in FIG. 6c. If the net effects of currents $I_1$ and $I_2$ are not equal the rising and falling segments of the triangular voltage waveform across capacitor 845 are asymmetric. In the limit as the net effects of current $I_1 \ll$ the net effects of current $I_2$ the triangular voltage waveform across capacitor 845 tends to the sawtooth waveform illustrated in FIG. 6b.

The time to charge and discharge capacitor 845 is determined by the magnitude of currents $I_1$ and $I_2$ generated by current sources 860 and 855. The sum of the times required to charge and discharge capacitor 845 to voltage levels that trigger comparators 815 and 820 determine the period of oscillation of the VCO. Therefore the magnitudes of currents $I_1$ and $I_2$ determine the period and frequency of oscillation of the VCO.

The control signal applied at input 870 controls current sources 860 and 855 and therefore controls the VCO frequency of oscillation. Although not shown a simple voltage or current splitter as well known to one versed in the art can be added between the control signal applied at 870 and current sources 860 and 855 to adjust the waveform symmetry.

Reversal of the voltage across capacitor 845 is controlled by the state of flip-flop 825. Counter 835 is triggered and modifies its output state correspondingly each time flip-flop 825 changes state. The change in counter 835 output state can be a modified voltage level as shown in FIG. 8b. Other voltage level modification schemes can be used as long as separate states are resolvable. Counter 835 output can also be of a digital format consisting of a digital word containing B bits. In such case a change in its output state can be a binary number where different states differ in one or more bits.

The output state of counter 835 changes each time flip-flop 825 changes states and therefore counts how many times the VCO output reached its minimum and maximum values. If the output state of counter 835 is an even number the output of the VCO traversed an integer multiple of $2\pi$ radians. The number of $2\pi$ radians traversed by the VCO output is then given by dividing the output count of counter 835 by two.

If the output state of counter 835 is an odd number the number of $2\pi$ radians traversed by the output of the VCO has an integer and a fractional part. The integer part of the number of $2\pi$ radians traversed by the output of the VCO is given by dividing by two a number obtained by subtracting one from the output state of counter 835. The fractional part of the number of $2\pi$ radians traversed by the output of the VCO depends on the degree of asymmetry between the rising and falling segments of the waveform and can be readily obtained by one skilled in the art. By way of example if the rising segment of the waveform takes twice as long as the falling segment of the waveform than then it requires ⅔ of a period of oscillation to complete.

The voltage across capacitor 845 is proportional to the phase traversed by the VCO output following the last change in state of flip-flop 825. It can be readily obtained by one skilled in the art if a) the trigger voltages of comparators 815 and 820 (i.e., the maximum and minimum voltages of the VCO output) and b) the asymmetry between the rising and falling segments of the VCO output waveform are known. By way of example consider that if a) the VCO output voltage is halfway between the minimum and maximum value on the rising segment of the waveform and b) the rising segment of the waveform takes twice as long as the falling segment of the waveform then the waveform measurement is at ⅓ of a period of oscillation.

The total phase traversed by the output of the VCO is obtained by summing the phase traversed by the VCO output as recorded by the voltage to phase converter 840 and by counter and phase converter 835. This function is performed by summer 880 and made available at output 890.

Switch 850 resets capacitor 845 and therefore the VCO oscillator output to an initial voltage output by voltage source 810. Flip-flop 825 is reset by signal 895. The initial voltage of voltage source 810 together with the reset state of flip-flop 825 and the degree of asymmetry between the rising and falling segments of the VCO output waveform are sufficient to determine the initial phase of the VCO output waveform. This derivation is well known to one versed in the art.

As well known in the art and described in the ICL8038 application notes literature sinusoidal, square and sawtooth waveforms are derived by additional internal circuits using the basic triangular waveform discussed herein. Therefore the items addressed herein apply equally to other VCO output waveform shapes.

The present invention thus replaces the conventional integrator component of a pixel structure with a high gain and high dynamic range integrator that performs the time integration of the input signal in the phase domain.

Figure 16:
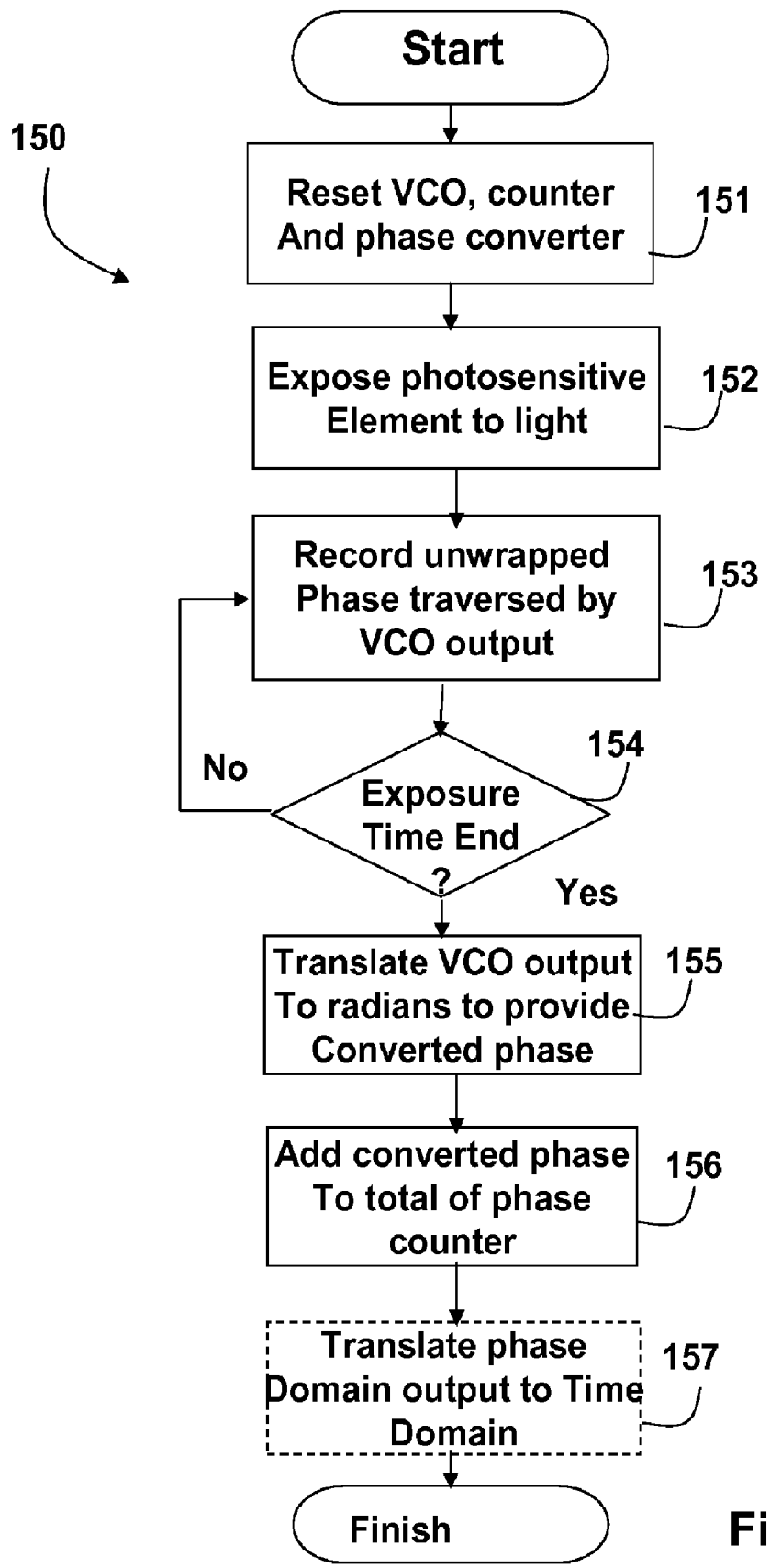
FIG. 16 is a flow diagram provided to illustrate several steps that may be performed during an image capture process by the phase domain integrator of FIG. 15.

FIG. 16 is a flow diagram which illustrates several exemplary steps that may be performed during a capture process 150 by a pixel structure that uses the phase domain integrator of the present invention.

At the beginning of said exposure time (step 151), the VCO output and the counter and phase converter 835 are reset. At step 152 the photosensitive element is exposed to light and changes its electrical characteristics causing the VCO output to change frequency. The photosensitive element can be any element such as a photodiode, a photogate, a phototransistor or a photoresistor. The present invention is also related to a solid-state imaging device, such as a CMOS or MOS imaging device having a geometric configuration of pixels, at least part of the pixels having the structure described above.

At step 153 counter and phase converter 835 records the unwrapped phase traversed by the VCO output. When it is determined at step 154 that the exposure frame ends the output of the VCO is translated to radians by voltage to phase converter 840 at step 155. The outputs of the counter and phase converter 835 and voltage to phase converter 840 are added by total phase adder 880. At step 156 the phase domain integration result may be translated to the time domain integration result if so desired. Step 156 is shown in dashed lines to indicate that it is not a necessary step of the capture process.

Exponential Gain Characteristic

Accordingly a method and apparatus for constructing a pixel structure having a high dynamic range has been described. FIGS. 9, 10A and 10B illustrate an exemplary embodiment and operation of one pixel structure of the invention which provides a generally linear integration response to input stimulus. According to another aspect of the invention, the integral output can also follow a non-linear characteristic where, by way of example and assuming a constant value input, a doubling of the integration time will not result in a doubling of the integral output value. By way of example, a nonlinear integral output can have an output characteristic related to an exponential function which is non-linear.

Figure 17:
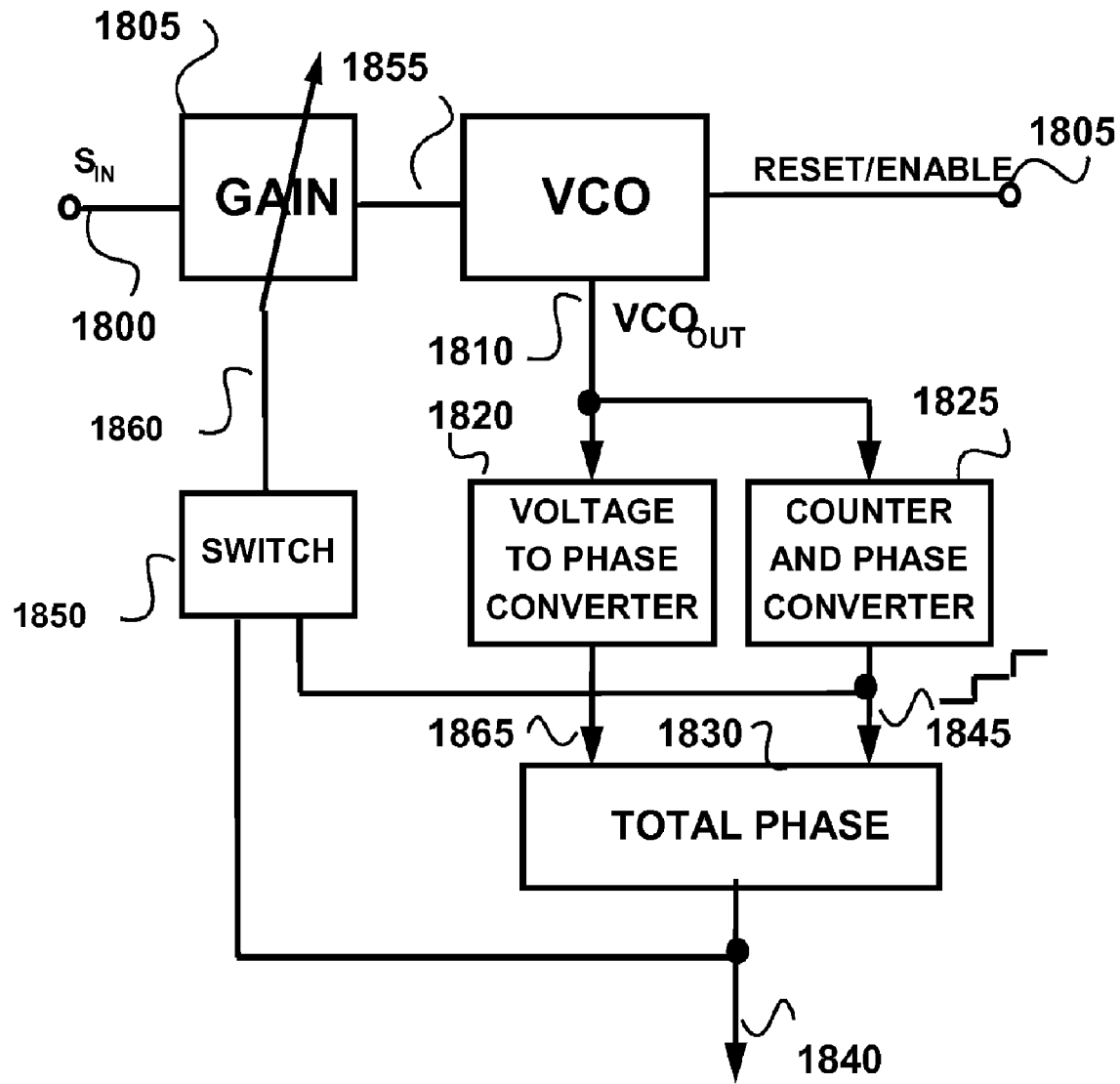
FIG. 17 illustrates a second embodiment of a phase integrator of the present invention capable of providing a non-linear response to electromagnetic radiation stimulus.

Any exponential function has the characteristic that its rate of growth (slope) is proportional to its value within a constant of proportionality. FIG. 17 illustrates a second embodiment of a phase domain integrator which is similar to that of FIG. 3b, modified to provide a rate of change of the integrator output value that is controlled by the integrator output value itself. Specifically, in the phase domain integrator of FIG. 17 the integrator output (the total phase traveled) can control the gain of the integrator and hence the rate of change of the integrator output Gain block 1805 can have a wide range of functional characteristics. For example, assume the gain of block 1805 is the inverse of input voltage 1860. As input voltage 1860 increases the gain of block 1805 decreases. Assuming a constant input 1800 ($S_{IN}$) the rate of increase of integrator output 1840 will decrease as control voltage 1860 increases and the gain of gain block 1805 decreases.

As illustrated in FIG. 17 switch 1850 can select signal 1840 or signal 1845 to control the gain block 1805. Signal 1840 is a continuous signal while signal 1845 is a discontinuous staircase signal. For the examples illustrated here switch 1850 selects signal 1845 to control gain block 1805.

In one embodiment, gain block 1805 is proportional to the inverse of the integrator output value. Thus the gain of gain block 1805 is the inverse of signal 1860 which is the output of switch 1850. Signal 1855 is the integrator input and equals the value of signal 1800 ($S_{IN}$) multiplied by gain block 1805. As the integrator output 1860 selected by switch 1850 increases in value, the gain of gain block 1855 decreases. For a constant value signal input 1800 ($S_{IN}$) signal 1855 decreases causing the phase domain integrator output to increase at a lower rate.

Figure 18:
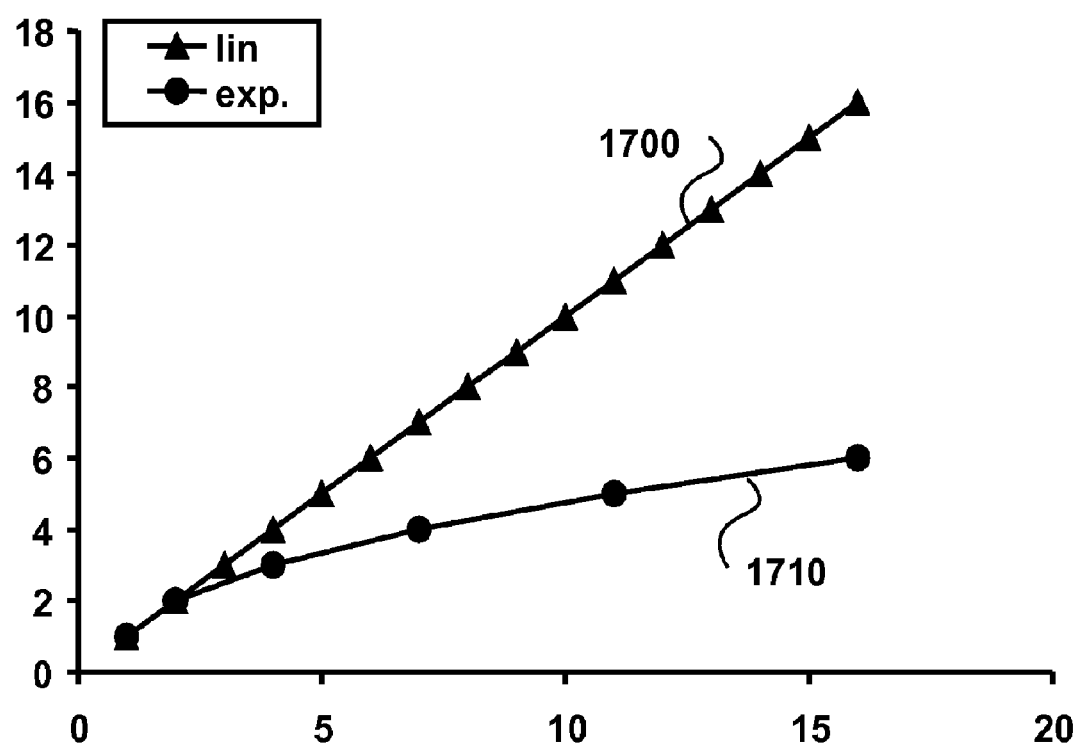
FIG. 18 is a graph illustrating exemplary linear and non-linear integrator responses that may be provided by an integrator of the present invention.
Figure 19:
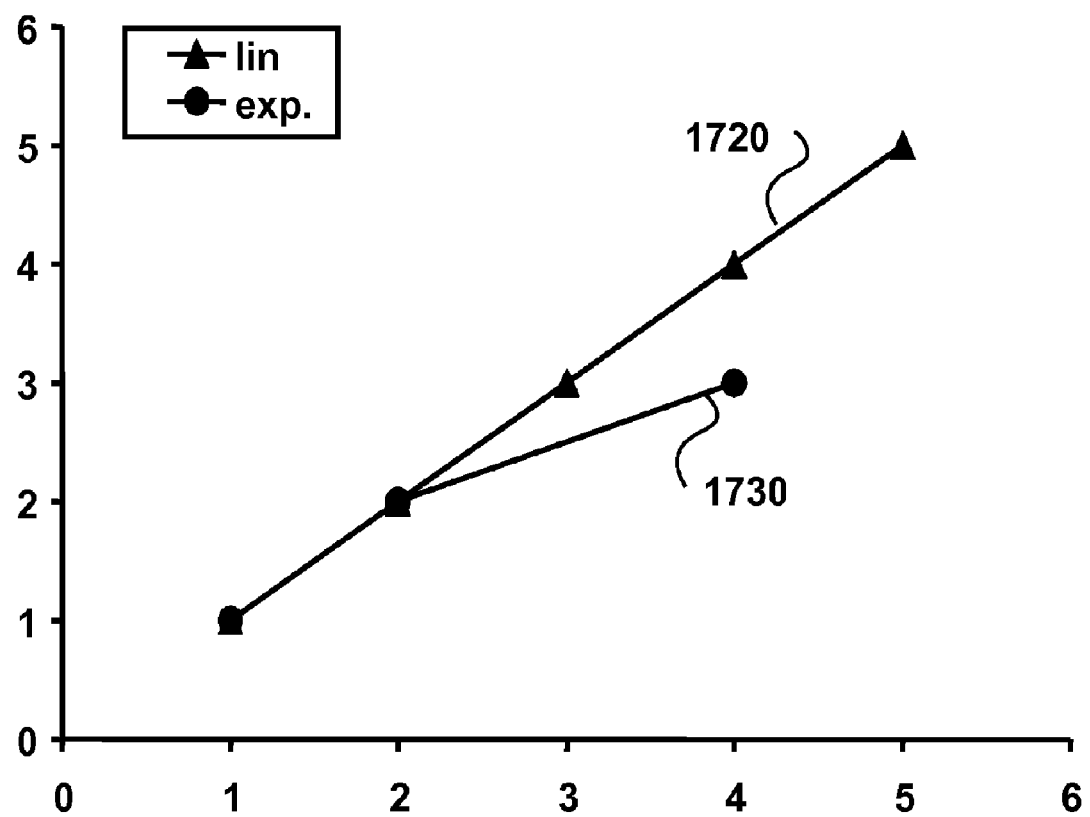
FIG. 19 is an enlargement of FIG. 18 around the origin.

FIG. 18 illustrates the output of an integrator function with linear (1700) and non-linear (1710) characteristic and with constant input. Curve labeled 1700 illustrates a linear integrator output characteristic and shows that a doubling of the integration time results in a doubling of the integrator output value. Curve labeled 1710 illustrates the nonlinear integrator output characteristic and shows that a doubling of the integration time does not result in a doubling of the integrator output value. In FIG. 19, curve 1710 is the integrator output for the case where the rate of change of the integrator output is controlled be the discontinuous staircase signal 1845 through an inverse relationship, i.e., the rate of change of the integrator output is proportional to the inverse of the integrator output represented by signal 1845.

FIG. 19 is an enlargement of FIG. 18 around the origin. Curve labeled 1720 illustrates the linear integrator output characteristic. Curve labeled 1730 illustrates the nonlinear integrator output characteristic. The two curves are identical for the initial portion of the curve that arbitrarily starts at time=1 and ends at time=2 (on the abscissa) and diverge thereafter. At that time the integrator output value curve 1730 equaled its initial value of one (the integrator output is shifted by one in order to avoid the potential gain nonlinearity. The final output will remove the initial value shift).

As evident in FIG. 19 the linear integrator output characteristic of curve 1700 increases linearly with time, since the input signal is assumed to be constant. As the integrator output increases and output component 1845 increases in value in a staircase fashion, the rate of increase of the integrator output decreases in the same staircase fashion. This is evident from curve 1710 of FIG. 18.

At time t=16 the linear integrator output reaches a value of 16 in this example. At time t=16 the nonlinear integrator output reaches a value of 6 in this example. Decreasing the rate of change of the integrator output as it increases in value advantageously reduces the number of states to encode for the final integrator value. In this example the linear integrator reached a value of 16 that requires an ADC with 5-bit output to encode while the nonlinear integrator only reached a value of 6 that requires an ADC with 3-bit output to encode. Neither device entered into the output saturation state.

Thus FIGS. 17-19 illustrate a method and apparatus by which the gain of the pixel structure can be controlled in response to pixel structure feedback. Although FIG. 17 described the use of a gain characteristic that the inverse of the integrator output, the present invention is not limited to any particular gain characteristic, and it is envisioned that there may be embodiments of a pixel structure of the invention with different, fixed, variable and/or adaptive gains which may be selected to meet design requirements. In addition, although FIG. 17 illustrates that the feedback is directly tied to an integrator output, it is appreciated that there may be design modifications made to process the integrator value in different ways to provide feedback to the gain device. Thus the present invention is not limited to any particular type of feedback, but rather encompasses the idea that feedback may be provided to the integrator to adjust integrator gain based on observed system conditions.

According a method and apparatus has been described for obtaining a read-out signal of a solid-state pixel structure (including CCD, CMOS and MOS-based pixel structures). The pixel structure includes at least a photosensitive element with an output node, means to integrate the output node signal in the phase domain and means to read the phase domain integration value. As described above, a means may also be provided for adjusting a gain of the integrator in response to observed system conditions. The use of the method disclosed herein to perform signal integration has advantages over conventional integrators and resolves difficult performance issues associated with conventional integrators. One advantage is the resolution of the potential to saturate the integrator output. VCO or oscillator outputs are strictly bound by upper and lower limits (peak values) which are not exceeded under any circumstances. Therefore output saturation conditions cannot occur. With such an arrangement a solid-state pixel is provided that is capable of producing a faithful reproduction of an image to be captured regardless of the intensity of electromagnetic energy impinging on the sensor.

Having described various embodiments of the invention, it will be appreciate that although certain components and process steps have been described the descriptions are representative only; other functional delineations or additional steps and components can be added by one of skill in the art, and thus the present invention should not be limited to the specific embodiments disclosed. The various representational elements may be implemented in hardware, software running on a computer, or a combination thereof and modification to and variation of the illustrated embodiments may be made without departing from the inventive concepts herein disclosed. Accordingly, the invention should not be viewed as limited except by the scope and spirit of the appended claims.

The invention claimed is:

1. A method for obtaining a high dynamic range read-out signal from a pixel structure includes the step of:
   applying a gain to an input signal provided by a photosensitive element of a pixel structure to provide a gain controlled input signal;
   forwarding the gain controlled input signal to a phase integrator of the pixel structure, the phase integrator comprising an oscillator and an accumulator for accumulating a number of phases traversed by a signal provided by the oscillator in response to the gain controlled input signal; and
   wherein the gain applied to the input signal is controlled in response to the number of phases traversed by the oscillator.

2. The method of claim 1 wherein the gain varies dynamically.

3. The method of claim 1 wherein the gain is a non-constant gain associated with a continuous output of the accumulator of the phase integrator.

4. The method of claim 1 wherein the gain is proportional to an output of the phase integrator.

5. A method for obtaining a high dynamic range read-out signal from a pixel structure includes the step of:
   applying a gain to an input signal provided by a photosensitive element of a pixel structure, wherein the gain is a non-constant gain related to a feedback of a phase integrator of the pixel structure, and wherein the non-constant gain is a discontinuous output of a phase accumulator of the phase integrator.

6. A method for obtaining a high dynamic range read-out signal from a pixel structure includes the step of:
   applying a gain to an input signal provided by a photosensitive element of a pixel structure, wherein the gain is a non-constant gain related to a feedback of a phase integrator of the pixel structure, and wherein the phase integrator includes an oscillator and a phase accumulator for accumulating phases of the oscillator during an exposure period.

7. A method for obtaining a high dynamic range read-out signal from a pixel structure includes the step of:
   applying a gain to an input signal provided by a photosensitive element of a pixel structure, wherein the gain is a non-constant gain related to a feedback of a phase integrator of the pixel structure, and wherein the gain is proportional to an inverse of an output of the phase integrator.

8. A pixel structure including:
   a gain controller for providing a gain controlled signal; and
   a photosensitive element for generating a signal in response to electromagnetic radiation, the photosensitive element having an output coupled to an input of the gain controller; and
   a phase integrator, coupled to the gain controller to receive the gain controlled signal and provide an output signal to an accumulator, the accumulator generating a phase integrated signal representative of radiation received at the pixel structure.

9. The pixel structure of claim 8 wherein an output of the phase integrator is coupled to an input of the gain controller.

10. The pixel structure of claim 8 wherein the gain is a non-constant gain related to an output of the phase integrator of the pixel structure.

11. The pixel structure of claim 8 wherein the gain is a non-constant gain related to a continuous output of the accumulator of the phase integrator.

12. The pixel structure of claim 8 wherein the input to the gain controller is proportional to a value of an output of the phase integrator.

13. The pixel structure of claim 8 wherein the phase integrator is coupled to the photosensitive element for integrating the response of the photosensitive element to the electromagnetic radiation over an exposure time period using phase information.

14. A pixel structure including:
   a gain controller for providing a non-constant gain controlled signal; and
   a photosensitive element for generating a signal in response to electromagnetic radiation, the photosensitive element having an output coupled to an input of the gain controller;
      a phase integrator, coupled to the gain controller to receive the gain controlled signal and provide an integrated signal representative of radiation received at the pixel structure; and wherein the non-constant gain is related to a discontinuous output of an accumulator of the phase integrator.

15. A pixel structure including:
   a gain controller for providing a non-constant gain controlled signal; and
   a photosensitive element for generating a signal in response to electromagnetic radiation, the photosensitive element having an output coupled to an input of the gain controller; and
      a phase integrator, coupled to the gain controller to receive the gain controlled signal and provide an integrated signal representative of radiation received at the pixel structure; and wherein the phase integrator includes an oscillator and an accumulator for accumulating phases of an output of the oscillator during an exposure period, and wherein the input to the gain controller varies during the exposure period.

16. A pixel structure including:

a gain controller for providing a non-constant gain controlled signal; and a photosensitive element for generating a signal in response to electromagnetic radiation, the photosensitive element having an output coupled to an input of the gain controller; and a phase integrator, coupled to the gain controller to receive the gain controlled signal and provide an integrated signal representative of radiation received at the pixel structure; and wherein the input to the gain controller is proportional to an inverse value of the output of the phase integrator.

* * * * *